United States Patent [19]

Beardsley et al.

[11] Patent Number: 5,528,755
[45] Date of Patent: Jun. 18, 1996

[54] INVALID DATA DETECTION, RECORDING AND NULLIFICATION

[75] Inventors: Brent C. Beardsley; Michael T. Benhase; Susan K. Candelaria; Joel H. Cord; Michael H. Hartung, all of Tucson, Ariz.; Bruce M. Henry, Los Gatos; Paul Hodges, San Jose, both of Calif.; Paul L. Leung, Tucson, Ariz.; Robert W. Shomler, Morgan Hill, Calif.

[73] Assignee: International Business Machines Corporation, Armonk, N.Y.

[21] Appl. No.: 995,092

[22] Filed: Dec. 22, 1992

[51] Int. Cl.⁶ .................. G06F 11/34; G06F 7/06
[52] U.S. Cl. .................. 395/185.01; 395/184.01; 364/266.3
[58] Field of Search ................ 395/575, 184.01, 395/185.01, 185.02, 185.07, 728; 371/29.5, 15.1, 37.1, 40.1, 40.2; 364/265, 265.1, 266.3, 943.91, 945.6

[56] References Cited

U.S. PATENT DOCUMENTS

| | | | |
|---|---|---|---|
| 4,371,949 | 2/1983 | Ke-Chu et al. | 364/900 |
| 4,625,273 | 11/1986 | Woffinden et al. | 364/200 |
| 4,733,396 | 3/1988 | Baldwin et al. | 371/38 |
| 4,780,809 | 10/1988 | Woffinden et al. | 364/200 |
| 4,920,539 | 4/1990 | Albonesi | 371/40.2 |
| 5,058,006 | 10/1991 | Durdan et al. | 364/945.6 |
| 5,146,461 | 9/1992 | Duschatko et al. | 371/40.1 |
| 5,249,284 | 9/1993 | Kass et al. | 395/465 |

*Primary Examiner*—Hoa T. Nguyen
*Assistant Examiner*—Trinh L. Tu
*Attorney, Agent, or Firm*—F. E. Anderson; R. M. Sullivan

[57] ABSTRACT

Often in DASD subsystems, circumstances can occur which prevent the full transfer of the required data from channel to subsystem during a write operation. The disclosed methods prevents this data from later being read and treated as valid data by the host processor. This is achieved by marking data as invalid within the storage subsystem once it is determined that a channel error has occured. Subsequently, upon reading that data, the host processor can be made aware of the data invalidity and treat the data accordingly. In a second embodiment, invalid data is discarded rather than stored over the previous valid version of the data, before it is ever stored on DASD.

8 Claims, 4 Drawing Sheets

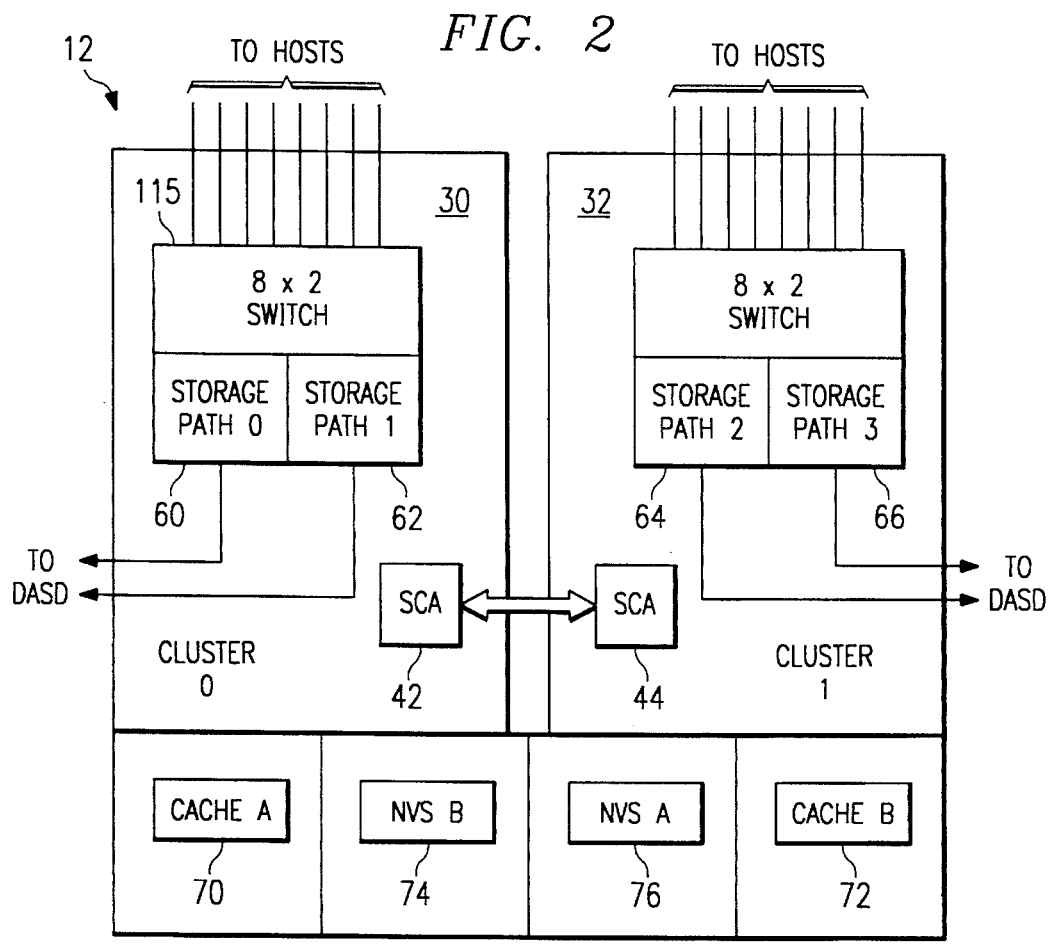
FIG. 2
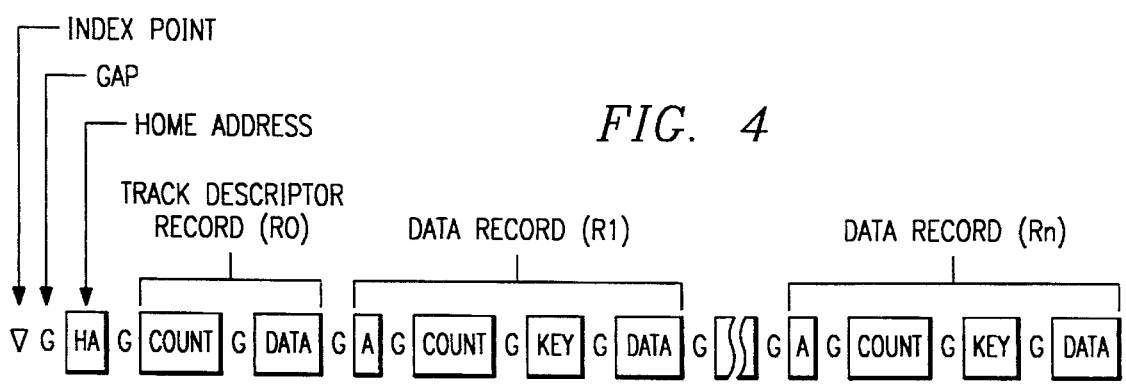
FIG. 4
FIG. 5

FIG. 6
FIELD STATUS FORMAT
| BIT | ADT FUNCTION |
|---|---|
| 0-7 | NOT SET BY STORAGE CONTROLLER |
| 8 | ERROR IN PRIMARY OF DUPLEX PAIR |
| 9 | HALT I/O, SELECTIVE RESET, SYSTEM RESET |
| 10 | NOT SET BY STORAGE CONTROLLER |
| 11 | NOT SET BY STORAGE CONTROLLER |
| 12 | SYSTEM ADAPTER OR ADT CHECK-2 |
| 13 | NOT SET BY STORAGE CONTROLLER |
| 14 | NOT SET BY STORAGE CONTROLLER |
| 15 | NOT SET BY STORAGE CONTROLLER |
FIG. 7
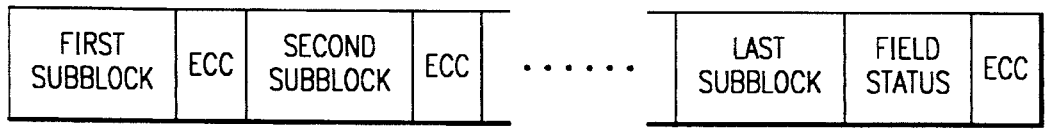
FIG. 8
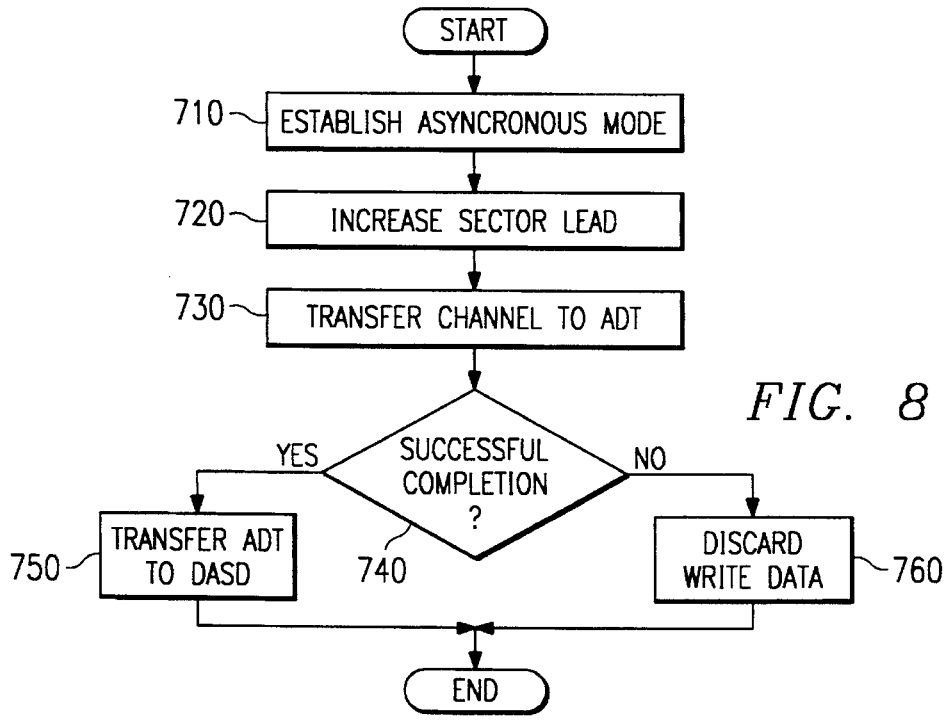

INVALID DATA DETECTION, RECORDING AND NULLIFICATION

BACKGROUND OF THE INVENTION

1. Field of the Invention

This invention relates to data storage subsystems and improvements providing data integrity within these subsystems. More particularly, this invention comprises methods for detecting, recording and properly treating data that has been corrupted before it reaches the subsystem.

2. Description of the Related Art

In recent years, the direction of the data processing industry has placed particular emphasis on on-line workstations, distributed processing and the introduction of information processing technology into many new application areas. As a result, there has been a corresponding increase in the use of on-line database systems and a growth in the requirement for storage capacity and increased reliability and flexibility in data storage devices.

This need has been met by Direct Access Storage Device (DASD) subsystems including storage controllers such as the IBM 3990 Model 3. The storage controller is installed between host processors and the DASD devices themselves. The controller acts not only as a path director for data flowing between the host and the DASDs but also as a performance enhancer for the data progressing system as a whole. This second activity is accomplished through the use of cached memory within the storage controller.

The IBM 3990 Model 3 is an example of a storage controller having a cache function. This controller can attach to 370, 370-XA and ESA/370channels which are all well known in the art. When the controller is operating with 370 channels, it provides path-independent device allocation. When, on the other hand, the 3990 is operating with 370-XA and ESA/370channels, it provides both path independent device allocation and dynamic path reconnection.

Communication between the host processor and the storage controller is accomplished through the use of a set of commands sent through channel devices which direct the controller to process specific data at specific locations. For example, in the IBM System/360 and System/370 host environments, the CPU issues a series of commands identified in 360/370 architecture as Channel Command Words (CCWs) which control the operation of the associated DASD through the storage controller.

A data transfer operation is initiated by the host CPU generating a START I/O instruction which is passed to the channel and causes control to be relinquished to a chain of CCWs. The CCW chain is then sent over the channel to the storage controller so that control operations can be effected, the proper storage device can be selected so that data transfer can occur.

Each CCW is separately resident in the CPU main store and must be fetched by the channel program, decoded and transferred to the storage controller. The CCW specifies the command to be executed and the storage area, if any, to be used.

When data is transferred between a host computer and a group of DASD devices through a storage controller, the data is transferred in a specific format comprising variable length records separated by fixed time gaps between the records and between the fields within the records. Each record typically includes several fields.

One of the problems inherent in large data processing systems is data integrity. This is especially true in large systems containing a storage subsystem with a DASD controller. Although various schemes, most often involving Error Checking and Correction (ECC), have been employed to detect data invalidity internal to various components (i.e. to the storage controller or to the host processor), there has, heretofore, been no satisfactory solution to data integrity problems that are created by data transfers between system components.

For example, when the host processor transfers data records through the channel to the storage controller for eventual storage on DASD, it is entirely conceivable that during that data transfer, a fault can occur. This can be due to a loss of power to the host processor or various system or software operating system failures such as a failed retry. Any of these events can cause the channel to transmit a Halt I/O, Selective Reset or System Reset command to the storage subsystem during data transfer of CCWs with or without user data.

If such a fault occurs during the transmission of user data, the user data can be truncated or improperly transmitted at the time of the fault. Worse yet, the data is never marked as bad so that during a subsequent read of the invalid data, neither the storage subsystem nor the host processor, when it receives the data, will be aware of any problem with the data.

It should also be noted that various other events can take place within the data storage subsystem because of an external problem-that would have the effect of producing invalid data within the storage subsystem without any indication that the data was, indeed, invalid. Such events include a situation where a retry fails or is not attempted such as in the case of a channel overrun or a Bus Out Parity Check. Moreover, in the case of a Dual Copy under error, where the storage controller is directed to proceed with a dual copy even if the data can not be read without error from the primary device, an exception can occur which will have the effect of damaging data.

It thus becomes necessary for the storage controller to handle these exception conditions in such a way that permits orderly control and recording of data defects as a result of exceptions. It is also desired that the overhead associated with the detection and recordation of invalid data be minimal both in terms of processing efficiency and freedom from hardware modifications. Moreover, it is important that the method be accurate in detection of invalid data.

This disclosure presents two solutions to the above mentioned problem, each described as a preferred embodiment. The first solution requires some hardware modification due to modification of data formatting, but it provides accurate and efficient identification of bad data. Furthermore, it allows the storage controller to notify the host processor, via the channel interface, of corrupted data which is transmitted as a result of a read request by the host.

The second solution requires only a microcode change within the storage controller. It uses the storage controller's ability to operate asynchronously in order to solve the above mentioned problem.

SUMMARY OF THE INVENTION

It is therefore an object of the invention to provide a method for managing a data storage subsystem in a data processing system.

It is another object of this invention to efficiently and accurately detect invalid data within a data storage subsystem.

It is a further object of this invention to provide a method and architecture whereby the data storage subsystem can inform a connected host processor of data that is deemed invalid.

It is a still further object of this invention to provide a method and architecture whereby the data storage subsystem can efficiently transfer data to a host processor with an indication of the validity of the data.

It is yet a further object of this invention to detect and report invalid data on DASD without a need to reformat existing DASD devices.

BRIEF DESCRIPTION OF THE DRAWINGS

The above and further objects, features and advantages of the present invention will become more apparent from the following detailed description taken in conjunction with the accompanying drawings, wherein:

FIG. 2 is a block diagram of the storage controller depicted in FIG. 1;

FIG. 4 is a representation of a data track in conventional Count-Key-Data (CKD) format;

FIG. 5 is a detailed representation of a COUNT field shown in FIG. 4 and including the FIELD STATUS area;

FIG. 6 is a table representing the bit assignments for the FIELD STATUS area;

FIG. 7 is a detailed representation of a DATA field shown in FIG. 4;

FIG. 8 is a logical flow chart of a write process executed by the storage controller when in normal write mode;

DETAILED DESCRIPTION OF THE INVENTION

Figure 1:
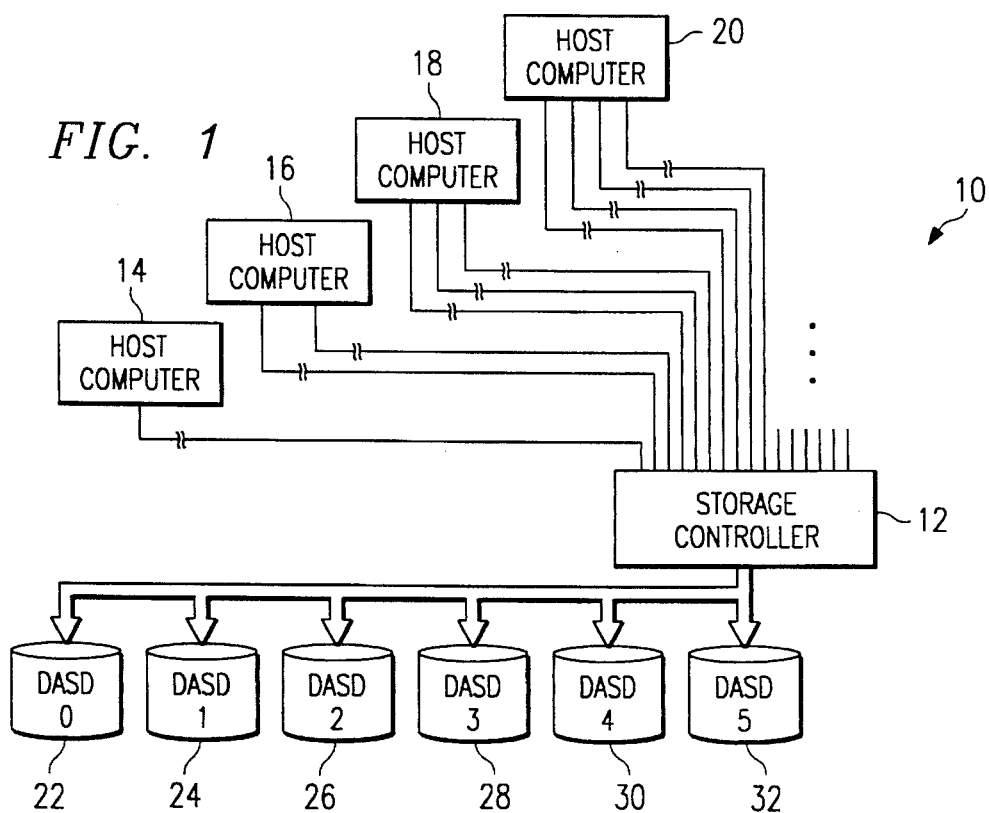
FIG. 1 is a block diagram of a data processing system typical of one used to implement the method and apparatus of the present invention.

Referring now to FIG. 1, a data processing system 10 in which the present invention is embodied will be described.

Data processing system 10 includes a storage controller 12, a plurality of host processors 14, 16, 18 and 20 and a plurality of direct access storage devices (DASD's) 22, 24, 26, 28, 30 and 32. DASDs are generally magnetic storage units such as disk drives. In this embodiment, the DASDs 22–32 are connected to the storage controller 12 for selective connection to any or all of the host processors 14–20. The storage controller 12 is preferably an IBM 3990 Model 3 or an enhanced version of the same. The enhanced version and its associated features will be discussed below. Host processors 14–20 are typically main frame systems such as the IBM 3090, the ES9000 Model computer, or comparable systems.

The host processors 14–20 are connected to storage controller 12 through either 4, 8, 12, or 16 system adapters (SAs). There are two types of SAs: parallel and ESCON. Parallel SAs provide attachment to channels via a parallel I/O interface. ESCON SAs provide channel attachment via the ESCON I/O interface. Various SA configurations can be used with a minimum of four and a maximum of sixteen SA's connected to the storage controller 12. Each parallel SA attaches to one host channel while an ESCON SA can attach to multiple host channels. Each SA, in turn, contains a number of channels which results in the ability to provide up to 128 channels in communication with the storage controller 12 when using ESCON SAs. While it is necessary to understand, generally, that channels connect to the storage controller 12, a discussion of the various channel configurations is beyond the scope of this specification.

FIG. 2 illustrates, through a block diagram, the general architecture of the storage controller 12 embodying this invention. It can be seen that each cluster is configured with two Storage Paths (SPs) 60, 62, 64 and 66. Each storage path contains a microcontroller capable of interpreting channel commands from the host and controlling the attached DASDs. Further, each cage contains Shared Control Array (SCA) storage 42 and 44. The SCA stores local status information as well as status information shared with the SCA located in the other cage within the storage controller 12. Typical shared data includes device status and reconnection data as well as a variety of external registers used by the microcontrollers contained in each of the storage paths 60, 62, 64, and 66. SCA data is accessible to all four storage paths 60, 62, 64, and 66. This access is 14 over fault independent paths so that in the case of a power failure in, for example, cage 1, storage path 0 (located in cluster 0) would continue to have access to the SCA of cage 0.

Figure 3:
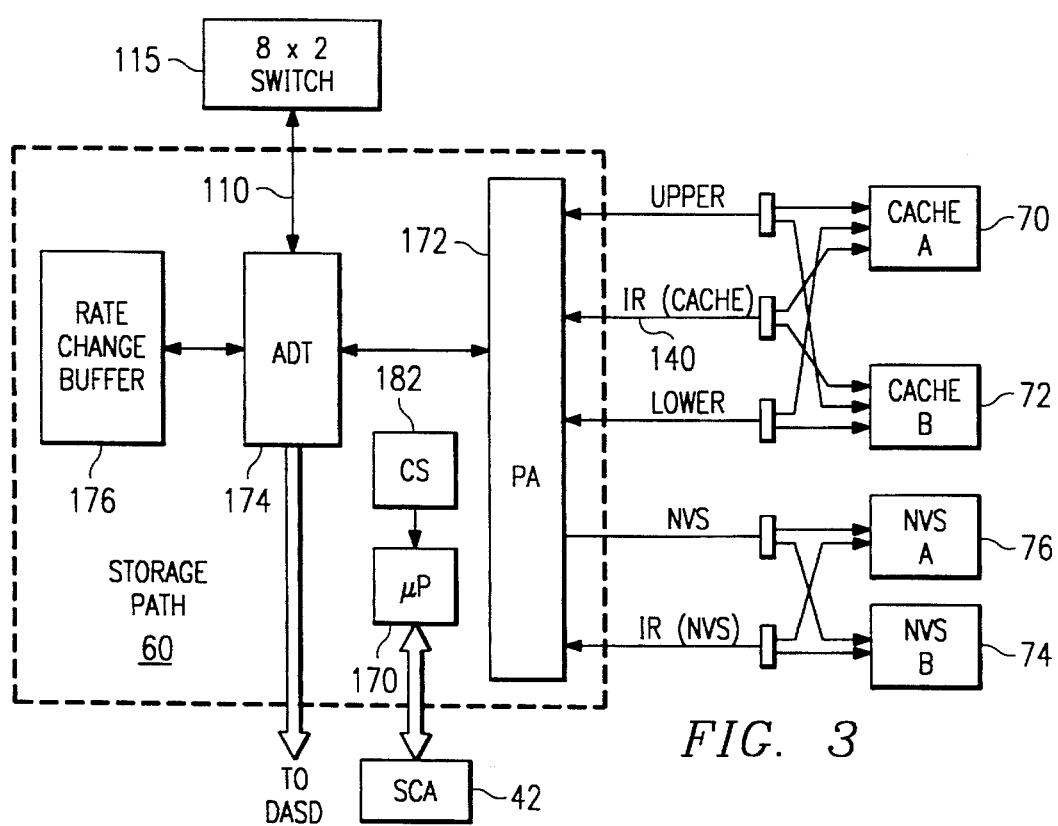
FIG. 3 is a block diagram of a storage path processor.

FIG. 3 shows the one of the four storage paths 60 in the storage controller 12 in a block diagram schematic. All four storage paths being identical, only one will be described herein. Storage path 60 is connected to 8×2 switch 115 by an upper port 110 and to a plurality of DASDs by a lower port 112. Data transfer between the 8×2 switch 115 and one of the DASDs during direct DASD operations occurs via an automatic data transfer circuit (ADT) 174 supported by a rate change buffer 176, if required. Rate change buffer 176 compensates for differences between the speed of data transference by DASD and that of channel to host communications. Channel transfers typically occur at a much higher rate than DASD to controller transfers.

The storage path 60 also contains a microcontroller 170 which functions to control all operations taking place on the storage path 60. The microcontroller 170 executes microinstructions which are loaded into a control store (CS) 182 through an external/support facility. The microcontroller 170 used in the preferred embodiment, in addition to having internal registers, is capable of addressing up to 256 external registers located on the storage path card. There is also provision for addressing locations external to the storage path 60 such as both cache elements and both NVSs using an indirect register interface.

A port adapter (PA) 172 provides control and data paths for the transfer of data between cache 70 and 72, nonvolatile storage 74 and 76, microcontroller 170 and upper and lower ports. It also allows for the microcontroller 170 to perform indirect addressing to cache and NVS, using the IRA and IRD registers.

The ADT 174 transfers data among the SA, the upper port, the lower port and the device connection. All transfers through the ADT can take place at up to 18 MB per second. Automatic data transfer through the ADT 174 is set up and initiated by microcode located within the control store 182. After initiation, no further microcode intervention is required until after the transfer is complete.

Caches 70 and 72 each contain two ports (upper and lower) to allow for two simultaneous data transfers to and/or from each cache element. By way of example, data may be transferred from cache and channel while also transferring data to cache from DASD. Data transfer is typically set up by microcontroller 170 and then taken over by the automatic data transfer 174 function without microcontroller intervention until transfer termination.

THE FIRST PREFERRED EMBODIMENT

A typical track format for data recordation on DASD is now described with reference to FIG. 4. The most widely used arrangement is referred to as Count-Key-Data format (CKD). CKD is used with the IBM 3990 Model 3 storage controller and the various DASD devices that it supports. The primary advantage of CKD is the flexibility it provides in allowing records to be of variable length. The CKD format, although well known in the art, will now be described briefly.

The basic CKD record format includes a COUNT field, an optional and variable length KEY field and a variable length DATA field. The COUNT field is fixed in length and specifies the record identification and the respective lengths of the KEY and DATA fields. The optional KEY field, if used, is of variable length and may be used to rapidly identify particular records which have been stored under a classification scheme based upon the KEY fields.

On each track there is an index which defines the physical radial location of the track on the disk. Following the index is a Home Address (HA) which contains information about the condition of the track, including the location and length of any defects on the track. Following HA is a track descriptor record (RO) which can be used to point to an alternate track, if the primary track is defective.

Following the RO record are the data records R1 to Rn, which are in conventional CKD format as described above. Physical gaps within and between the data records, represented as "G" in FIG. 4, separate the recorded areas on the track. The length of the gaps varies with the particular track format and the location of the gap. The gaps are required between the fields to perform various hardware functions, including the encoding and decoding of data and the padding of variable length fields.

FIG. 5 illustrates the format of the track records that are used in the first preferred embodiment of this invention. It should be noted that this record includes FIELD STATUS data denoted FS. Although FIG. 5 represents the data format as stored on DASD, the FIELD STATUS data also travels with the data fields throughout the storage controller 12. The FIELD STATUS data, wherever located, indicates the validity of the attached data field. The primary purpose of FIELD STATUS is to increase data integrity during data transfers including data transfers within the storage controller 12.

The table in FIG. 6 describes bit assignments for the FIELD STATUS area. As required by the first preferred embodiment of the instant invention, FIELD STATUS is a two byte object that travels with various data fields through the data fields and indicates the validity of the attached data field. The ADT 174 appends FIELD STATUS to fields coming from the SA and strips FIELD STATUS from data fields going to the SA. This is because the SAs (both parallel and ESCON) do not maintain or support FIELD STATUS.

The first preferred embodiment provides a method for the storage controller 12 to maintain data sufficient to notify the host of any data integrity problems as a result of channel errors during data transfers. This is accomplished in four broad steps. The storage controller 12 must first identify the exception condition occurring during the data transfer. It must then mark the data as bad. Later, when the data is accessed, the indication of damaged data must be detected. Finally, the host must be signalled that the data was damaged when it was written but that the subsystem is operating correctly and is not in need of repair. Each of these steps will now be discussed in detail.

The storage controller 12 will detect two types of error conditions. The first type comprises a Halt I/O, Selective Reset or System Reset. These are specific sequences on a parallel channel or frames for an ESCON channel and are well known in the art. Should one of these three events occur and cause truncation of a data transfer from the channel to the Storage Controller 12, the SA will raise a signal or a discrete wire to the ADT 174. The ADT 174 will set bit 12 in a FIELD STATUS register within the ADT 174. At the end of the data transfer the ADT 174 places FIELD STATUS in the data stream either to the rate change buffer 176 or a cache 70 or 72.

The second type of fault detected is a general fault in data transfer. Faults in data transfer set bits in check registers. The output of these bits are then combined into summary bits in other check registers. The output of these bits are eventually combined in a CHECK-2 bit within the ADT 174. When CHECK-2 is set the ADT 174 will cause bit 9 of FIELD STATUS to be set.

Once an exception condition has occurred, the next step is to mark the data as bad. The method by which this is done in the instant invention is to tag any damaged field in the FIELD STATUS area with an indication of bad data. The FIELD STATUS area is a two byte field with the first byte (bits 0–7) of this field used to flag exceptions detected by the DASD 22–32 and the second byte (bits 8–15) used to flag exceptions detected by the storage controller 12.

The instant invention is limited to the second byte and uses three bits of the second byte to flag errors detected during channel transfers. Referring again to FIG. 6, it is seen that bit 9 is set when a channel error due to a Halt I/O CCW, Selective Reset CCW or System Reset CCW occurs. This typically causes truncation of the data with zero padding written over the damaged fields. This bit is set by the storage controller hardware.

The second bit used is bit 12 which is used to indicate a SA problem or an ADT CHECK-2 situation. As a result a check condition has occurred within the subsystem and there has been some degree of data corruption. This bit is also set by storage controller hardware.

Bit 8 is used to indicate that the field could not be read without error from the primary of a duplex pair during a dual copy operation under error. This bit is set by the storage controller hardware.

FIELD STATUS, in addition to being kept within the storage controller 12, is sent to the DASD in the track format described above only if the particular DASD device supports the track format including FIELD STATUS. This is illustrated in FIG. 7. The DASD units receive FIELD STATUS, update it if necessary, and store it on the disk. When the field is subsequently read, the FIELD STATUS is transferred back to the storage controller 12.

When data records are received from the channel and through the SAs, the ADT 174 first appends all zeros as FIELD STATUS data to the associated data field. If the SA has indicated a Halt I/O, Selective Reset or System Reset condition, the ADT sets bit 9 of FIELD STATUS. Bit 12 of FIELD STATUS is set in the SA has detected a CHECK-2 condition.

BAD FIELD STATUS is FIELD STATUS that indicates that an error occurred during the write operation of that field. Any operation that either uses a COUNT field with BAD FIELD STATUS, transfers a field with BAD FIELD STATUS to a channel or uses a field with BAD FIELD STATUS in a search operation (either for a search command, or a LOCATE RECORD) will be terminated and cause a check condition to occur.

Because the controller 12 can not always tell when the KEY field ends and the DATA field begins, it always stores the KEY and DATA fields as one field in the ADT buffer during write operations. This means that there will be a single FIELD STATUS for the KEY and DATA fields while in the ADT buffer. The errors recorded in this FIELD STATUS are tagged to the DATA field. Therefore, should an error occur while writing the KEY field, it is possible that the error will be flagged in FIELD STATUS against the DATA field and not against the KEY field. This condition may allow some search key chains to operate as a bad KEY field without being notified, however, a KEY field can never be read without also reading the associated data field and the error will be detected when the DATA field is later read.

The indication of damaged data within the data storage subsystem is detected by the hardware in two places. The first detection point is on the Director-Device Connection (DDC) when the data is read from DASD. The DDC is a microcode controlled interface that provides the means for attaching DASD to the storage controller 12. Command and status transfer between the storage paths 60–66 and the DASD is controlled by microcontroller 170. Data transfer is controlled by the hardware after being set up by the microcode for an automatic data transfer through the ADT 174.

The indication on the DDC interface is a status bit. This bit must be a status bit rather than a check bit. If a check bit were used, it would have to be processed every time that it was set. This would cause timing critical code to examine and reset the bit for KEY and DATA fields. The extra overhead introduced in this instance would be unacceptable. A status bit, on the other hand, permits checking the bit or ignoring it as conditions dictate.

A second indication of damaged data occurs on the channel interface when data is transferred to the channel or used to satisfy a channel search. This causes a check condition to be recognized because the channel has accessed damaged data.

Finally, the controller 12 must have some way of signalling the host processor that data that is sent to the host processor is invalid. This is accomplished by using a special exception class which is sent from the controller 12 to the host. The exception is reported as a data check since the data is bad and there is no storage subsystem malfunction. The host is also notified that the problem is not due to media but is instead a problem that occurred while the data was being written and was not recovered.

THE SECOND PREFERRED EMBODIMENT

As discussed above, the first preferred embodiment of the instant invention requires a hardware modification due to the reformatting of tracks on the DASD. A second preferred embodiment of the instant invention which does not require this hardware modification or reformatting of data tracks is now described.

It should first be noted that the second preferred embodiment of this invention requires no hardware modification because the solution to the above described problem is addressed only through microcode changes located within the storage controller 12. This preferred embodiment does not require marking of data as invalid but instead uses the asynchronous capability of existing DASD storage controllers to maintain data integrity such that no invalid data records are ever stored within the storage controller 12 or the DASD devices 22–32.

The operation of the storage controller 12 in an asynchronous fashion, which is required under this embodiment, will now be described. The asynchronous operation enables the channel and the device to transfer data independently of each other. This is accomplished by inserting a buffer in the data path between the device and the channel with separate data paths for the channel and the device, each under the control of separate processors. In this manner, the device processor can access records in one portion of the buffer while another portion of the buffer is being used by the channel processor. Channel programs can be executed such that the channel and storage control activities required to end execution of one command and advance to the next do not have to occur during the inter-record gap between two adjacent fields.

This procedure has the further and more important advantage of allowing data records that are corrupted because of a channel error to be discarded instead of written over previously valid data. This can not be accomplished in a synchronous environment. In a synchronous environment, the channel and device must perform data transfer in lock-step. As write data is being transferred from the channel to the control unit, the data is simultaneously transferred to DASD. As a result, if a channel error occurs while performing a write operation, the previous version of the record on disk is concurrently being overlaid with the invalid data from the channel.

With an asynchronous environment, the previous valid version of the record can be preserved until the channel data transfer has been completed successfully. Operations, thus, do not need to be performed in lock-step. Write data can be transferred from the channel to the storage controller 12 first, and then transferred from the controller 12 to the DASD only when the first step has completed without a channel error or some other fault as described above.

The processing under the second preferred embodiment will now be described. All processing described herein refers to storage control processing in a cached environment, the typical configuration of the storage controller 12 of the preferred embodiments. In a caching environment, two situations must be addressed. The first is a normal write and the second is a DASD fast write. Both write operations will be described now as a preliminary matter, before the discussion of the treatment of each operation within the storage controller 12. It is important to note that the following discussion of write operations are described with reference to synchronous processing. The method of the invention modifies the write operations to remedy the above described data integrity problem.

A normal write is the basic cache writing operation in the storage controller 12. If a copy of the requested data is in the cache storage when the channel initiates a write request, a "write hit" occurs. The controller 12 then writes the data directly from the channel to DASD, and, at the same time, updates the data in cache storage. This approach. assures that the data in the cache storage is current when it is accessed again for 8 read operation. Data is simultaneously written to the cache storage and to DASD with a device end signal returned at completion. It is important to note that a device end can not be returned until data is written successfully to DASD.

The second cache operation of importance to the invention herein is a "DASD fast write". As with any cached write operation, DASD fast write requires an NVS backup, associated with the cache memory to prevent data loss in the event of a power failure. DASD fast write allows for faster write operation processing in that access to the DASD device is not necessary if the data is present in cache. If it so happens that the data to be written is present in the cache, instead of writing the data update to DASD, the storage director copies the data received from the channel into cache and NVS. Once this is done, the storage director can return channel end and device end status.

In this manner host processing can continue without waiting for the data to be placed on DASD. The data is not actually written to DASD until it is necessary to free space in the cache or NVS. If the data is not present in the cache, then a "write miss" occurs and the data is written to DASD and to cache simultaneously and immediately. In addition, the remainder of the track containing the record to be written is staged to cache for future anticipated use.

Now, turning to FIG. 8 it will be described how a storage controller operating under this invention will treat data under a normal write situation so that invalid data is prevented from being stored within the storage subsystem. The typical subsystem action which occurs during one of the above mentioned exceptions is to record a good block of data, replacing damaged or missing data with zeros (padding) and including the usual error checking codes (ECC) to validate the zeros as good data stored. The invention herein recognizes the undesirability of current subsystem processing and provides a method to solve the resulting data integrity problem with only a microcode change.

As can be seen in block 710 asynchronous mode is first established. Asynchronous mode is established by the controller 12 when it receives the first CCW from the channel program asynchronous mode is always established with ESCON and is established in a parallel adapter environment with ECKD.

Once asynchronous mode has been established the sector lead is increased as shown in block 720. This allows the record being transferred to be entirely captured in the ADT 174 before being written to DASD 22–32 or discarded, as the case may be. The channel then transfers the selected records into the storage controller ADT buffer 730. Records which have been padded with zeros as a result of a channel or host errors are detected as invalid at this point. If data is determined at block 740 to be invalid then the data is discarded at block 760. Otherwise, data is transferred from the ADT to the selected DASD device 750 only after successful completion of the channel to ADT transfer. The processing ends at block 770.

Figure 9:
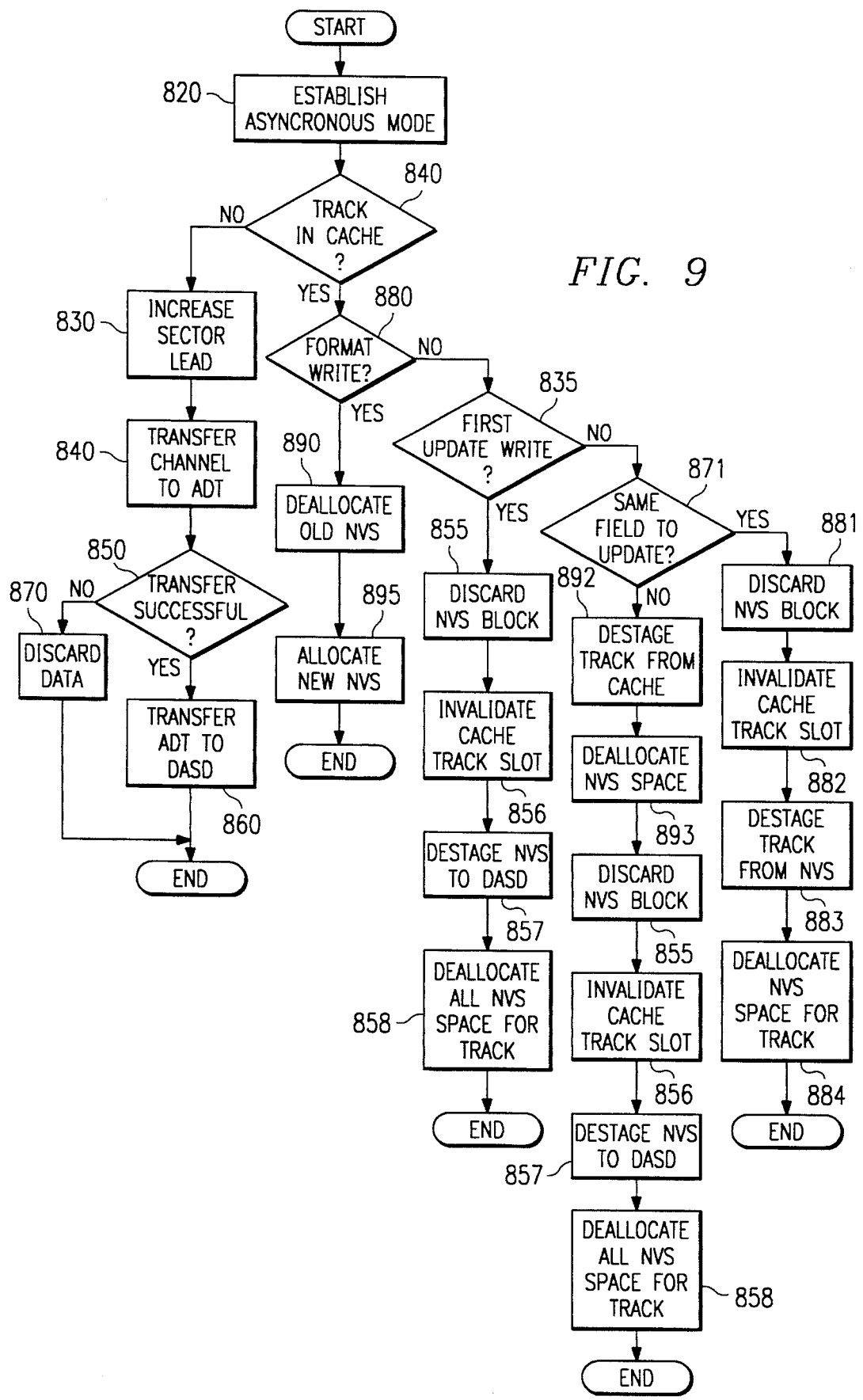
FIG. 9 is a logical flow chart of a write process executed by the storage controller when in DASD fast write mode.

FIG. 9 illustrates storage controller processing in the DASD fast write mode according to the second preferred embodiment of this invention. Processing is initiated for a write operation at block 810. As with normal writes, the controller 12 is placed in asynchronous mode at block 820. It is then determined whether or not the record to be written is contained on a track currently residing in cache at block 840. If not, processing As treated in the same manner as if a normal write operation was taking place. This procedure includes blocks 830, 840, 850, 850 and 870. A description of the same series of process steps can be found above with respect to normal write operations and will, therefore, not be repeated here.

If the track containing the record to be written is in cache, it will be determined, at block 880, if a format write or update write is taking place. A format write command establishes COUNT areas of the track and formats the KEY and data areas of the track or tracks. In a format write with DASD fast write, the new record is written, and the rest of the track is formatted for new data. There is no need to verify the data on the track before allowing the cache write. An update write, on the other hand, changes the KEY and data areas of existing records without affecting other areas of the record or other records on the same track. Update writes are the most common form of write operations taking place in the storage controller 12.

If the write operation is a format write, then old NVS blocks corresponding to the track containing the record to be written are deallocated 890 and new NVS blocks are allocated 895. The padded records are detected as channel data arrives into cache and NVS. The Format Write is converted into an erase. The erase command is a Format Write that erase the track starting with the record referenced. For example, a Format Write of record 3 would write record 3 and erase the rest of the track. Erase record 3 would erase record 3 and the rest of the track. Therefore, if a channel exception occurs during a Format Write, the record is erased and so is the rest of the track.

If the write operation is an update write, it must first be determined, at block 835, whether it is a first update write or a subsequent update write. In the case of a first update write the track containing the record to be written will be in cache but no NVS block will have been allocated for this record. Processing for a first update write is as follows: padded/invalid records are detected as channel data arrives into cache and NVS. The NVS block for this record is discarded 855, the cache track slot is invalidated 856 and all remaining records for the track are destaged 857 from NVS to DASD. While the destage occurs and until it is completed, the track is in "pinned NVS only" state. Finally, all NVS space for this track is deallocated 858.

In the case of an update write that is a subsequent update to a record, the track will be in cache and an NVS block will already be allocated for this record. At this point it must be determined 871 if the same fields as in a previous update write are to be updated or if it is a new field to be updated. If an update is to occur on a field previously updated then new NVS space is allocated and the previous NVS block is deallocated after a successful write operation. Again, padded/invalid records are detected as channel data arrives into the cache and newly allocated NVS storage. The new NVS block for this record is then discarded 881 and the cache track slot is invalidated 882. Next, the earlier version of the record to be written and all other records residing on its track are destaged 883 from NVS to DASD. The track is in "pinned NVS only" state until the destage completes successfully. Finally, all NVS space for the track is deallocated 884.

If the subsequent update write is directed to different fields from those updated previously, then the track is destaged 892 from cache to DASD and all NVS space for the track is deallocated 893. Next, the NVS block for this record is discarded 855, the cache track slot is invalidated 856 and all remaining records for the track are destaged 857 from NVS to DASD. While the destage occurs and until it is completed, the track is in "pinned NVS only" state. Finally, all NVS space for this track is deallocated 858.

If a redundancy check occurs in the NVS during emergency NVS destage at power up, the NVS block is discarded. If two NVS blocks exist for the same record, both blocks are destaged to DASD in order upon power up. If a storage controller power loss occurs before a padded NVS block is deallocated, then the padded NVS block is destaged to DASD upon power up.

While the invention has been particularly shown and described with reference to the preferred embodiments thereof, it will be understood by those skilled in the art that various changes in form and details may be made therein without departing from the spirit and scope of the invention.

What is claimed is:

1. In a data processing system having a host processor, said host processor coupled to a plurality of channels, a controller attached to said host processor through said plurality of channels, and a plurality of data storage devices coupled to said controller, said controller including a plurality of storage paths for managing data movement between said host processor and said plurality of data storage devices, a method in said controller for detecting and reporting to said host processor invalid data, due to an exception condition, received from said host processor comprising the steps of:

identifying the exception condition causing the invalid data to be invalid;

marking the invalid data processed under said exception condition as invalid;

in response to a subsequent request by said host processor to read the invalid data, detecting that said invalid data is marked as invalid;

signaling the host processor that the invalid data is marked as invalid; and wherein said exception condition is a power loss in the host processor, an operating system failure within the host processor, or a failed retry.

2. The method as set forth in claim 1 further comprising the step of notifying the host processor that the controller and the plurality of data storage devices are operating properly.

3. The method as set forth in claim 1 wherein said exception condition is a Dual Copy under error.

4. In a data processing system having a host processor, said host processor coupled to a plurality of channels, a controller attached to said host processor through said plurality of channels, and a plurality of data storage devices coupled to said controller, said controller including a plurality of storage paths for managing data movement between said host processor and said plurality of data storage devices, each said storage path having an Automatic Data Transfer (ADT) buffer, a method in said controller for detecting and reporting to said host processor invalid data received from said host processor comprising the steps of:

establishing an asynchronous mode in the controller for allowing said invalid data received from said host processor to be discarded in said ADT buffer such that said invalid data is not written to said plurality of data storage devices;

transferring a data record from said host processor through one of said plurality of channels into said ADT buffer;

in response to a channel error during said data record transfer from said host processor through one of said plurality of channels into said ADT buffer, discarding said data record in said ADT buffer and preserving a previous copy of said data record on one of said plurality of data storage devices; and in response to a successful data record transfer without a channel error from said host processor through one of said plurality of channels into said ADT buffer, further transferring said data record to one of said plurality of data storage devices.

5. The method as set forth in claim 4 wherein the channel error is indicated in said controller by said data record being padded when said data record arrives at said ADT buffer.

6. In a data processing system having a host processor, said host processor coupled to a plurality of channels, a controller attached to said host processor through said plurality of channels and operating in Direct Access Storage Device (DASD) fast write mode, a plurality of data storage devices coupled to said controller, said controller including a cache memory having a track slot, a non-volatile storage (NVS) array having a block and shadowing said cache memory, and a plurality of storage paths for managing data movement between said host processor and said plurality of data storage devices, said plurality of storage paths each having an automatic data transfer (ADT) buffer, a method in said controller for detecting and reporting to said host processor an invalid data record received from said host processor comprising the steps of:

establishing an asynchronous mode in the controller for allowing said invalid data received from said host processor to be discarded in said ADT buffer such that said invalid data is not written to said plurality of data storage devices;

transferring a data record from said host processor through one of said plurality of channels to said controller;

determining whether a previous version of said data record is located in said track slot in said cache memory;

determining whether a block in said NVS array has been allocated for said data record;

determining whether said data record is invalid;

wherein if said transfer of said data record comprises a format write and said data record is invalid, deallocating a block in said NVS array associated with said data record and converting the format write command into an erase command;

wherein if said transfer of said data record comprises a first update write and said data record is invalid, deallocating said block in said NVS array associated with said data record and invalidating said track slot in said cache memory associated with said data record;

wherein if said transfer of said data record comprises a subsequent update write and a previously non-updated data record within said track slot is to be updated and said data record is invalid, destaging said track slot containing said data record from said cache memory to one of said plurality of data storage devices, deallocating said block in said NVS array associated with said data record, and invalidating said track slot in said cache memory associated with said data record; and wherein if said transfer of said data record comprises a subsequent update write and a previously updated data record within said track slot is to be updated and said data record is invalid, discarding said block in said NVS array allocated for said data record, invalidating said track slot in said cache memory associated with said data record, destaging said block in said NVS array associated with said previously updated data record from said NVS array to one of said plurality of data storage devices, destaging said track slot containing said data record from said cache memory to one of said plurality of data storage devices, and deallocating said block in said NVS array associated with said previously updated data record.

7. The method as set forth in claim 6 further comprising subsequent to the first update write and said data record is invalid, further destaging other data records within said track slot containing said data record from said NVS array to one of said plurality of data storage devices.

8. The method as set forth in claim 6 further comprising labelling all data records within said track slot associated with said data record as pinned in said NVS array until the destage operation is complete.

* * * * *